(12) United States Patent
Mejean et al.

(10) Patent No.: US 7,594,156 B2
(45) Date of Patent: Sep. 22, 2009

(54) HIGH-EFFICIENCY COMPACT TURBO-DECODER

(76) Inventors: Philippe Mejean, 43 A, Quai du Drac, 38600 Fontaine (FR); Joël Cambonie, Les Echarras, 38190 La Combe de Lancey (FR)

( * ) Notice: Subject to any disclaimer, the term of this patent is extended or adjusted under 35 U.S.C. 154(b) by 251 days.

(21) Appl. No.: 10/324,247

(22) Filed: Dec. 19, 2002

(65) Prior Publication Data

US 2003/0126538 A1 Jul. 3, 2003

(30) Foreign Application Priority Data

Dec. 20, 2001 (FR) .................................. 01 16619

(51) Int. Cl.
*H03M 13/00* (2006.01)
(52) U.S. Cl. .................... 714/755; 714/785; 714/776
(58) Field of Classification Search ................. 714/755, 714/785, 746, 786, 788, 795, 762, 776, 782, 714/787, 11; 375/262, 341
See application file for complete search history.

(56) References Cited

U.S. PATENT DOCUMENTS

| | | | | |
|---|---|---|---|---|
| 5,535,225 | A * | 7/1996 | Mayhew et al. | 714/785 |
| 5,563,897 | A * | 10/1996 | Pyndiah et al. | 714/755 |
| 5,974,580 | A * | 10/1999 | Zook et al. | 714/755 |
| 6,041,368 | A * | 3/2000 | Nakatsuji et al. | 710/20 |
| 6,182,261 | B1 * | 1/2001 | Haller et al. | 714/758 |
| 6,219,815 | B1 * | 4/2001 | DesJardins et al. | 714/781 |
| 6,292,918 | B1 * | 9/2001 | Sindhushayana et al. | 714/755 |
| 6,304,995 | B1 * | 10/2001 | Smith et al. | 714/786 |
| 6,526,538 | B1 * | 2/2003 | Hewitt | 714/780 |
| 6,738,948 | B2 * | 5/2004 | Dinc et al. | 714/794 |
| 6,763,494 | B2 * | 7/2004 | Hewitt | 714/780 |
| 6,845,481 | B2 * | 1/2005 | Gueguen et al. | 714/755 |
| 6,996,767 | B2 * | 2/2006 | Chang et al. | 714/786 |
| 7,149,951 | B2 * | 12/2006 | Seo | 714/786 |
| 7,200,799 | B2 * | 4/2007 | Wang et al. | 714/795 |
| 2001/0039638 | A1 | 11/2001 | Gueguen et al. | |
| 2004/0123225 | A1 * | 6/2004 | Cameron | 714/781 |

FOREIGN PATENT DOCUMENTS

WO WO 00/19616 A 4/2000

OTHER PUBLICATIONS

French Search Report from French priority application No. 01 16619 filed Dec. 20, 2001.
Adde P et al; *Design And Performance Of A Product Code Turbo Encoding-Decoding Prototype*, Annals of Telecommunications, presses Polytechniques et universitaires Romandes, Luasanne, CH, vol. 54, No. Mar. 3-4, 1999, pp. 214-219, XP000834643.

* cited by examiner

*Primary Examiner*—Phung M Chung
(74) *Attorney, Agent, or Firm*—Lisa K. Jorgenson; James H. Morris; Wolf, Greenfield & Sacks, P.C.

(57) ABSTRACT

A circuit and a method for decoding data coded by blocks by a turbo-code including successive steps. One of the steps may use n first processors adapted to operating in parallel on n lines, or columns, of a block. Different steps may be performed in parallel on the same block of turbocoded data.

19 Claims, 7 Drawing Sheets

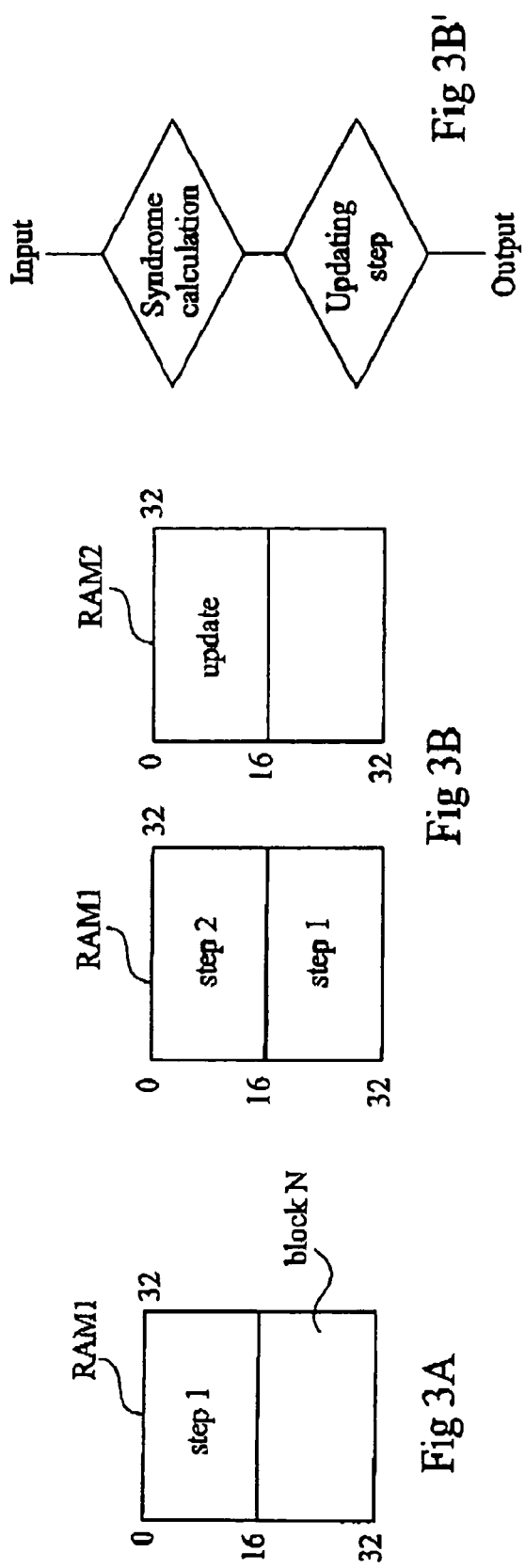

HIGH-EFFICIENCY COMPACT TURBO-DECODER

BACKGROUND OF THE INVENTION

1. Field of the Invention

The present invention relates to error correction codes, and in particular to the decoding of turbo-codes.

2. Discussion of the Related Art

Turbo-codes, recently introduced, are error correction codes. Error correction codes have a technical effect and solve a significant technical problem. Indeed, they enable restoring the value of erroneous bits, for example, after a storage or a transmission. It can even be said that, without error correction codes, any digital information storage or transmission would be illusory. Turbo-codes are very efficient error correction codes.

FIG. 1A illustrates the principle of a turbo-coder, also called a turbo-code coder. On an input IN, the data digitized in the form of a bit sequence reach a coder 1 (COD). Coder COD is a simple coder which calculates and assigns to the data an error correction code in the form of redundancy bits. Coder COD may be of any known type, for example, a coder of convolutional, BCH, extended BCH, Reed Solomon, LDPC ("Low Density Parity Check") type, etc.

The output of coder COD is sent to an interleaver 2. Interleaver 2 operates on blocks and provides the data received from a block in a different order. Interleaver 2 drives the input of a coder 3 (COD'). Coder COD' is a simple coder of same type as coder COD. The data provided by output OUT of coder COD' are said to be coded by turbo-codes and they include, in addition to the bits received as an input, the redundancy bits provided by coders COD and COD'.

FIG. 1B illustrates the principle of a turbo-decoder, also called a turbo-code decoder. On an input IN', the turbo-decoder receives data coming from the turbo-code coder, generally after storage or transmission. The data to be decoded are sent to a decoder 1' (DEC). Decoder DEC implements a function inverse to that of coder COD and it ensures a first decoding of the data. The output of decoder DEC is sent to an interleaver 2' which implements the same interleaving operation as interleaver 2. The output of interleaver 2' is sent to a decoder L(DEC'). Decoder DEC' implements a function inverse to that of coder COD'. The output of decoder DEC' is fed back into input IN' via a deinterleaver 4. Deinterleaver 4 implements a deinterleaving function inverse to the function implemented by interleaver 2'.

The processing performed by elements DEC, 2', DEC', and 4 on an input data block forms an iteration.

Turbo-decoders perform several iterations based on the same input data, the number of corrected errors being all the greater as the number of iterations is great. The number of performed iterations depends on the desired BER ("Bit Error Rate"). A first half iteration is performed by decoder DEC and interleaver 2' and a second half-iteration is performed by elements DEC' and 4. In a second iteration, elements DEC, 2', DEC', and 4 carry the data coming from 4 in the first iteration, possibly after weighting and together with the input data of the original block.

In the last iteration, the data are sampled from an output OUT', here the output of decoder DEC'.

When coders COD and COD' are coders of convolutional type, the architectures of the turbo-coder and turbo-decoder follow closely enough the simplified diagrams of FIGS. 1A and 1B.

In the case where the data are coded, for example, by codings of BCH, extended BCH, Reed Solomon type, the turbo-coder and turbo-decoder architectures somewhat deviate from the simplified diagram.

FIG. 2A illustrates a block of data intended to be coded by means of such codes. The data block appears in the form of a rectangular table 6, including t2 lines and t1 columns. Data Di to be coded, in the form of bits, arrive one after the other and are arranged in table 6 in a known order. In FIG. 2A, t1=6 and t2=5. Data D0 to D5 fill the first line of the table, data D6 to D11 fill the second line of the table, and data D24 to D29 fill the last line of the table. Table 6 has the shape of a matrix and may be stored in a RAM.

FIG. 2B shows a rectangular table 10 illustrating the turbo-coding of data Di of block 6. Table 10 includes n2 lines and n1 columns, with n1>t1 and n2>t2. Table 10 is formed of three blocks. Block 6 of data Di is present at the top left. A block 7 including t2 lines and (n1−t1) columns is present to the right of block 6. Block 7 encloses codes Ci, in the form of bits, resulting from the application of coder COD. A block 8 including (n2−t2) lines and n1 columns is present under blocks 6 and 7. Block 8 encloses codes C'i, in the form of bits, resulting from the application of coder COD'. In FIG. 2B, n1=9 and n2=7.

Codes Ci are obtained by coding data Di line by line by means of coder COD. Thus, the coding of first line D0 to D5 of block 6 provides three codes C0, C1, and C2 which form the first line of block 7. The second line of block 7 encloses codes C3 to C5, resulting from the coding of data D6 to D11 and the last line of block 7 encloses codes C12, C13, and C14, corresponding to the coding of data D24 to D29.

When the line coding is over, the columns of blocks 6 and 7 are coded by means of code COD'. The first column of block 6, corresponding to data D0, D6, D12, D18, and D24, is coded by means of code COD' and provides two codes C'0 and C'1, forming the first column of block 8. The same occurs for the next columns of block 6. The last line of block 6, corresponding to data D5, D11, D17, D23, and D29, provides codes C'10 and C'11 forming the sixth column of block 8.

The next columns of block 8 contain codes C'i resulting from the coding of bits Ci by coder COD'. Thus, the coding of the first column of block 7, corresponding to codes C0, C3, C6, C9, and C12, provides codes C'12 and C'13 forming the seventh column of block 8. The last column of block 7, containing codes C2, C5, C8, C11, and C14 provides, after coding by coder COD', codes C'16 and C'17 forming the last column of block 8.

In the case of FIGS. 2A and 2B, the interleaving is performed by the successive coding of the data in lines and in columns, and a specific interleaving circuit is not useful.

The n1·n2 bits of block 10 are sent by any means to a turbo-decoder. The decoding is performed line by line, then column by column, one iteration being performed after a complete decoding of block 10. Several iterations are performed, to obtain a desired error rate.

A general problem of turbo-decoding is its slowness. Indeed, several iterations are required to obtain the desired error rate. These iterations implement complicated algorithms and the processing steps are relatively long. Further, in transmission, the data must be processed in real time by the turbo-decoder, and with a minimum latency. Beyond a given flow rate, the circuit which has performed the first iteration on a data block may not perform the next iterations, since the incoming data run against the data being processed.

A prior art solution to this problem is to arrange several turbo-decoders in series, each turbo-decoder performing an iteration. This results in turbo-decoding circuits of small compactness.

SUMMARY OF THE INVENTION

An object of the present invention is to provide a fast turbo-code decoding method.

Another object of the present invention is to provide a compact turbo-code decoder.

To achieve these and other objects, the present invention provides a method for decoding data coded by blocks by a turbo-code including successive steps implementing different algorithms. At least two of said successive steps are capable of being applied in parallel to different data blocks.

According to an embodiment of the present invention, said successive steps include a first step to calculate a syndrome and a second updating step using the syndrome calculated in the first step.

According to an embodiment of the present invention, the first step is performed on a first portion of a first data block while the second step is performed on a second portion of said first block or on a portion of a second data block.

According to an embodiment of the present invention, the first step, or syndrome calculation step, uses n first processors adapted to operating in parallel on n lines, respectively columns, of a block and the second step, or updating step, uses m second processors adapted to operating in parallel on m lines, respectively columns, of a block.

According to an embodiment of the present invention, a data block has dimensions 32×32 and n=m=16.

According to an embodiment of the present invention, the data are coded by a coding of BCH or extended BCH type.

According to an embodiment of the present invention, the updating step implements a Berlekamp algorithm or a Euclid algorithm followed by a Chase-Pyndiah algorithm.

The present invention also relates to a circuit for decoding data coded by blocks by a turbo-code. The circuit includes:

a first means able to calculate in parallel n syndromes, each syndrome corresponding to the syndrome of a line, respectively, a column, of a first portion of a first data block, and a second means able to update in parallel m lines, respectively columns, of a second portion of said first block or of a portion of a second data block.

According to an embodiment of the present invention, the circuit includes a third means adapted to storing at least two successive data blocks.

According to an embodiment of the present invention, a data block to be decoded has dimensions 32×32 and n=m=16.

The foregoing objects, features and advantages of the present invention, will be discussed in detail in the following non-limiting description of specific embodiments in connection with the accompanying drawings.

BRIEF DESCRIPTION OF THE DRAWINGS

FIGS. 3A to 3I illustrate an example of a turbo-decoding according to the present invention.

DETAILED DESCRIPTION

Figure 1A:
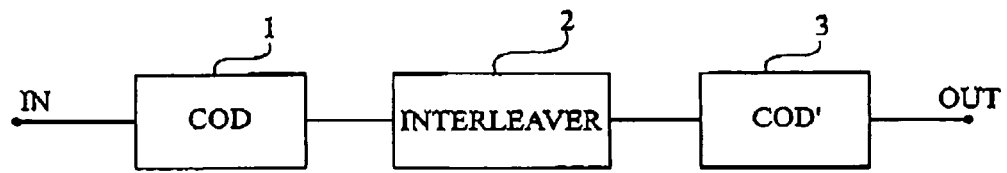
FIG. 1A, previously described, illustrates the principle of a turbo-coder.
Figure 1B:
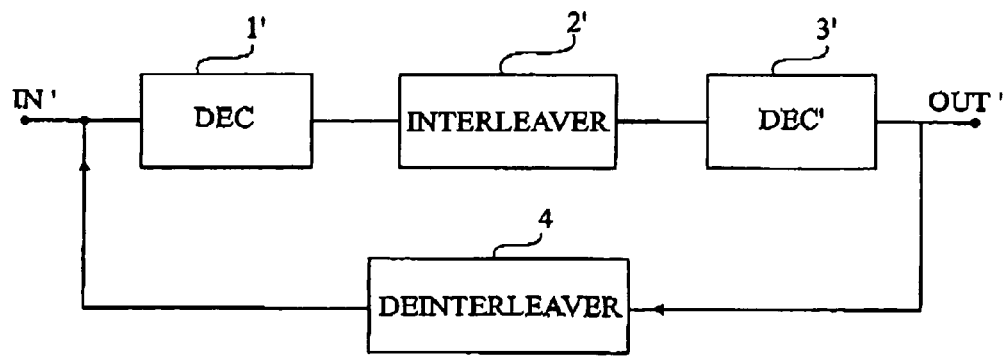
FIG. 1B, previously described, illustrates the principle of a turbo-decoder.

In the present invention, as well as in prior art, a shortening-puncturing processing may occur. The shortening is an operation including not filling the entire block 6 with data Di, filling bits being inserted in place of the missing bits Di. For this purpose, when block 6 is formed by means of input data Di, some locations of block 6 are not filled by the input data and a zero is placed therein. The location of the filling bits is known.

Coders COD and COD' code data Di after the shortening operation, that is, they code the lines and columns of block 6 containing the filling bits.

The puncturing includes only transmitting part of codes Ci and/or C'i. The location of the non-transmitted codes Ci and C'i is known.

The filling bits, as well as the "punctured" codes, are not transmitted. Thus, the transmitted blocks include a reduced number of bits, corresponding to the sole input data Di and to the codes Ci and C'i which have not been punctured.

The transmission may occur via any channel. It may for example be wireless transmission, a transmission over a telephone cable or another cable, etc.

The transmission modifies the transmitted bits and adds a function f(t) thereto which, theoretically, may take any value from $-\infty$ to $+\infty$.

In a conventional example of a coding for transmission, occurring after the turbo-coding, the transmitted bits, "0" and "1", are coded with one of the two values "−1" and "+1" (for example, "−1" corresponds to "0" and "+1" to "1"). In this case, the received bits have a value equal to $-1+f(t)$ or $+1+f(t)$, according to whether a "0" or a "1" has been transmitted. Each received bit thus appears in the form of an analog value.

In the decoder, the received analog value corresponding to each bit is quantified in an M-bit word. For example, in a practical implementation of the turbo-decoder of the present invention, the received words are represented by signed numbers of four bits, the first bit corresponding to the sign bit (0 for a positive word and 1 for a negative word). The received words are thus represented by values ranging, in decimal numeration, from −8 to +7. In such a word, the sign corresponds to what is thought to be that of the transmitted bit, and the absolute value of the word corresponds to the confidence which is had in the sign. If the confidence is equal to 7 or 8, it is almost sure that the sign is right. However, if the confidence is close to 0, the value of the sign is very uncertain.

In receive mode, the turbo-decoder first forms the block to be decoded, by means of the received words. Where a zero has been inserted in block 6, −7 is directly placed in the block to be decoded since it is sure that the transmitted bit was "0" ("−1"). Zero is placed at the location of the punctured codes, since the value of the punctured code is unknown and there are as many chances of having punctured a "0" or a "1".

At the end of this operation, the decoder has a block to be decoded including n2 lines of n1 words each.

Figure 2A:
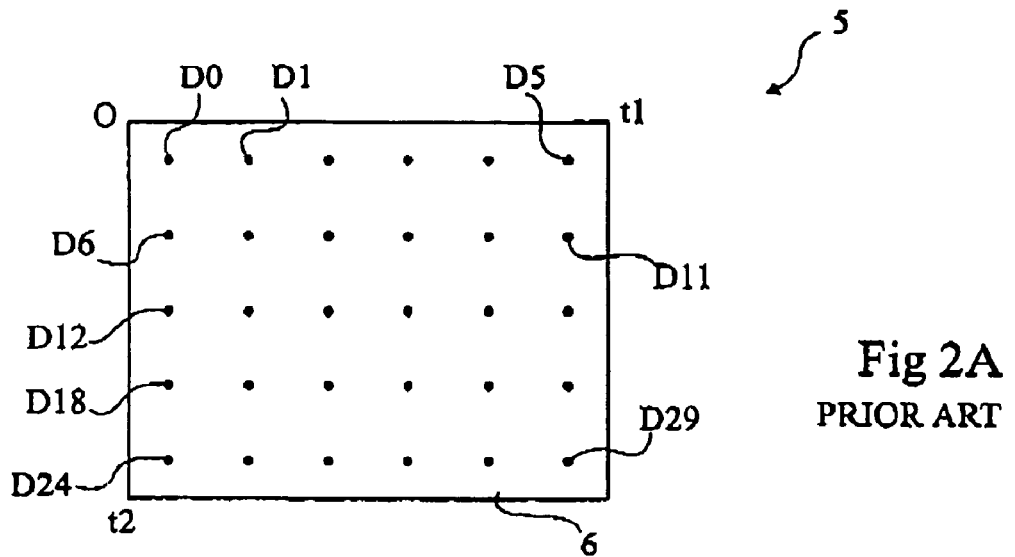
FIG. 2A, previously described, illustrates the arrangement of data coded by blocks.
Figure 2B:
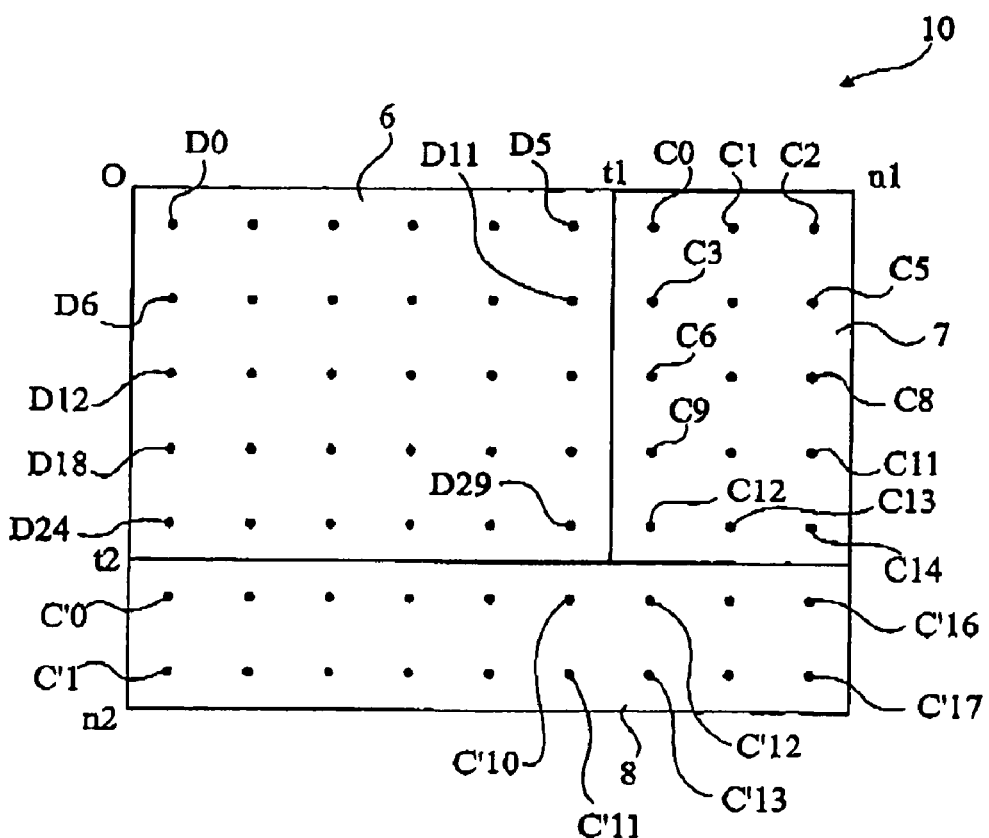
FIG. 2B, previously described, illustrates the principle of the turbo-coding of data coded by blocks.

In FIG. 3A, the words of a block are arranged in a RAM RAM1. For the description, parameters n1 and n2 of FIG. 2B have both been chosen to be equal to 32 and parameters t1 and t2 have been chosen to be equal to 24. Memory RAM1 may thus be represented in the form of a table of dimension 32 by 32, a memory location being able to contain a word of at least four bits.

After the filling of memory RAM1, the first iteration is started by a line-by-line coding.

The decoding of a line (like that of a column) includes two successive steps. A first step corresponds to a syndrome calculation, by means of the line words. The syndrome calculation, which is known, may be carried out in any appropriate manner and will not be explained in further detail. It uses the word signs.

The first step is followed by a second step. The second step, which can be called the actual decoding or updating step, uses the result of the first step and implements algorithms adapted to providing a new line in which errors have been corrected. The new line, which is the result of the first half-iteration, is in principle a more faithful representation of the transmitted line than of the received line. If the new line includes too many errors, it is not used and the line before decoding is used afterwards instead of the decoded line.

In the implemented example of realization, the codes are BCH or extended BCH codes, and the second step implements a Berlekamp algorithm (or a Euclid algorithm), followed by a Chase-Pyndiah algorithm. The Chase-Pyndiah algorithm has been chosen for its robustness. The result of the application of the Chase-Pyndiah algorithm provides the confidences of the line words, possibly associated with new signs. The durations of the first and second steps are on the same order.

In prior art, existing circuits use two processors, one for the syndrome calculation and one for the updating. Each of the processors processes one line or one column at a time. This results in a long processing time. For example, if the time of a step is equal to d for a line, a half-iteration lasts for approximately 48.d for 24 lines. Further, since prior art processors operate on a same block, the end of a half-iteration must be awaited to start the second one, which results in an additional loss of time.

In the present invention, several processors, each having the ability of processing a line or a column, are used in parallel, during the first step as well as during the second one. Further, in the present invention, the processors may operate on different blocks.

The idea of using several processors in parallel may appear to be simple. However, the practical implementation of several processors of this type in an integrated circuit is not simple to implement since these processors take up a large surface area. Further, those skilled in the art used to consider that the arranging in parallel of several of these processors would take up so large a silicon surface area that the circuit would not be realizable. However, the applicant, using a technology under 35 μm, has formed a circuit including 16 processors adapted to calculating the syndromes of 16 lines and/or columns in parallel, and 16 processors adapted to carrying out the updating step over 16 lines and/or columns in parallel, with a general circuit surface area smaller than 10 mm².

Memory RAM1 of FIG. 3A contains the words of a block of rank N. The first 24 words of the first 24 lines correspond to the received data bits. The other words of the first 24 lines correspond to the received codes Ci. The words of the last eight lines of memory RAM1 correspond to the received codes C'i.

FIG. 3A illustrates a first processing phase. During the first phase, the first 16 lines of memory RAM1 are processed at the same time by the 16 processors adapted to the syndrome calculation, hereafter called the first processors (step 1). At the end of the first phase, a syndrome is obtained for each of the first 16 lines. The duration of the first phase is substantially equal to d.

FIG. 3B illustrates a second phase of the processing, following the first phase. FIG. 3B shows memory RAM1 and a RAM RAM2, also of dimensions 32×32.

During the second phase, two operations are performed.

On the one hand, the first 16 processors calculate the syndrome of the lines of rank 17 to 32 (the first line is the line of rank 1). Even if only the lines of rank 17 to 24 correspond to a coding by coder COD, a decoding of all lines of the matrix may be performed. Indeed, codes C'i resulting from the coding of codes Ci form, with codes C'i resulting from the coding of data Di, lines that can be decoded in the same way as the other matrix lines. In an alternative embodiment, it is also possible to only decode the lines corresponding to a coding by coder COD.

On the other hand, meanwhile, the other 16 processors, called the second processors, provided with the syndromes of the first 16 lines, perform the actual decoding of the first 16 lines of memory RAM1 (step 2). The result of the decoding, also called updating, is stored, after weighting by a coefficient p, in memory RAM2, playing the function of a working memory. Coefficient p is a coefficient ranging between zero and one. Coefficient p increases along with the iteration number. For example, for the first iteration, weighting coefficient p is equal to 0.4 and, for the fourth iteration, p is equal to 0.5.

FIG. 3B' shows a flow chart illustrating the two decoding steps including the syndrome calculation and the updating step.

FIG. 3C illustrates a third processing phase, following the second phase. FIG. 3C shows memory RAM1, memory RAM2, and a RAM RAM1', also of dimension 32×32. Memory RAM1' is provided to store—after possible restoring operations following a shortening and/or a puncturing—a block N+1 arriving after block N.

During the third phase, two operations are also performed.

On the one hand, the updating step (step 2) is carried out on the lines of rank 17 to 32 of block N, contained in memory RAM1. The readjustment or updating of these lines is stored in lines 17 to 32 of memory RAM2. Thus, at the end of the third phase, memory RAM2 includes all lines 1 to 32 of block N, updated. The first half-iteration is thus over at the end of the third phase.

On the other hand, memory RAM1', which contains block N+1, is used to calculate the syndrome of its first 16 lines (step 1). The fact, according to the present invention, of processing different blocks in parallel when the first and second processors are not used together on a same block will enable a considerable time gain. This advantage, together with that provided by the presence of several processors of a same type in parallel, very significantly improves the turbo-decoding performances.

Figure 3D:
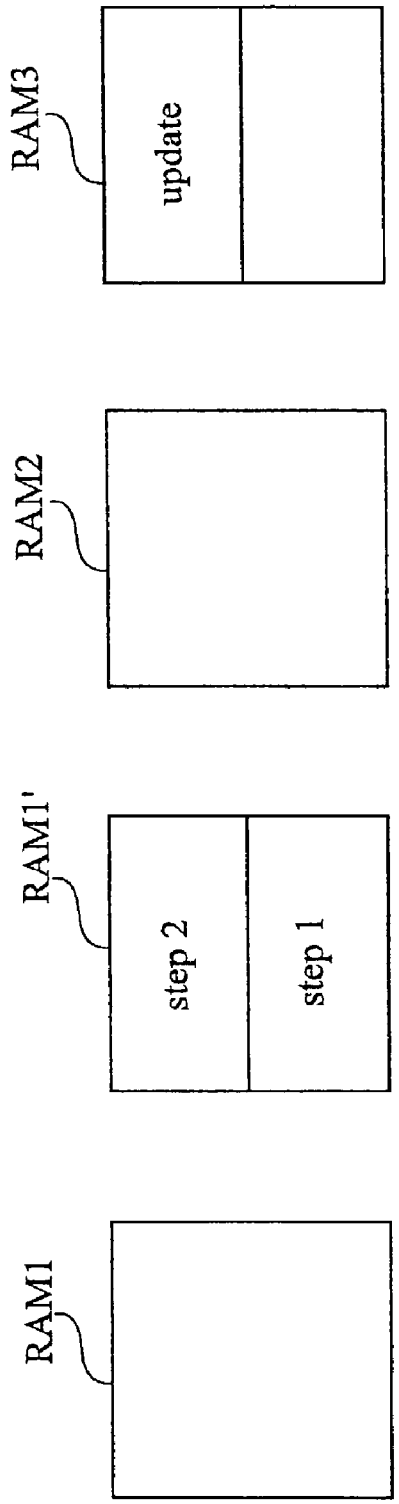

FIG. 3D illustrates a fourth phase of the processing. FIG. 3D shows memory RAM1, memory RAM2, memory RAM1', and a RAM RAM3, also of dimensions 32×32.

During the fourth phase, the two processor groups both act on block N+1, contained in memory RAM1'. The first processor group calculates the syndrome of the lines of rank 17 to 32 of memory RAM1'. The second processor group performs the actual decoding of the first 16 lines of memory RAM1'. When the decoding of the first 16 lines of memory RAM1' is over, the readjusted lines are stored in memory RAM3.

Figure 3E:
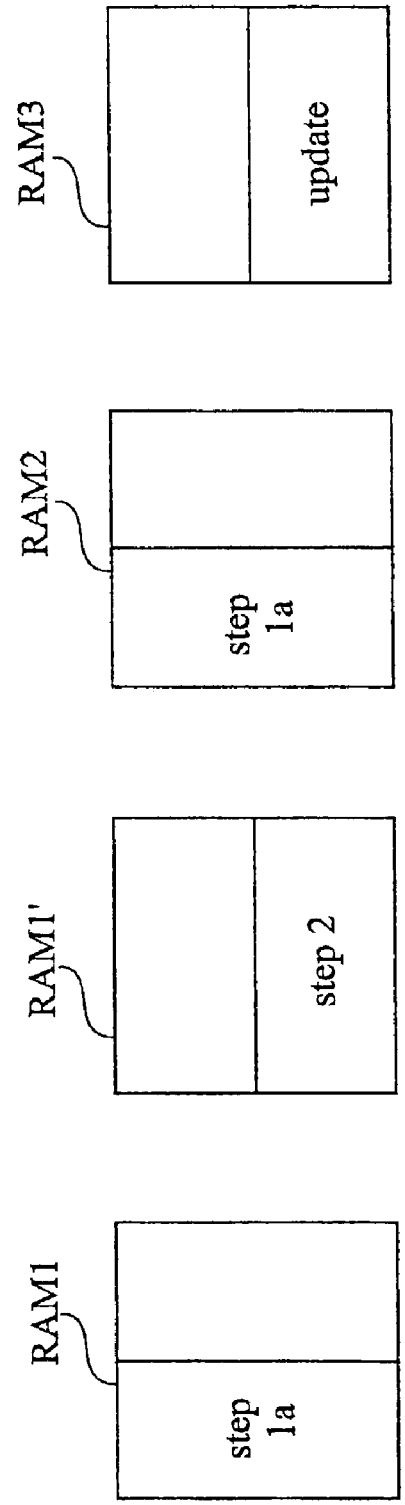

FIG. 3E illustrates a fifth phase of the processing. During this phase, the decoding of the lines of block N being over, the second half-iteration may start. For this purpose, the first 16 processors act on the first 16 columns of memory RAM2 and of memory RAM1. Indeed, the first processors act on columns formed of a sum of the columns of the original block N, contained in memory RAM1, and of the columns of block N after the first half-iteration, contained in memory RAM2. This is symbolized in FIG. 3E by indication "step 1a" at the level of the first 16 columns of memories RAM1 and RAM2.

Further, during the fifth phase, the second 16 processors act on memory RAM1' and decode the lines of rank 17 to 32. The readjusted lines are stored in memory RAM3. At the end of the fifth phase, memory RAM3 thus encloses the lines of rank 1 to 32 of block N+1, updated. The columns of block N+1 can thus now be processed.

Figure 3F:
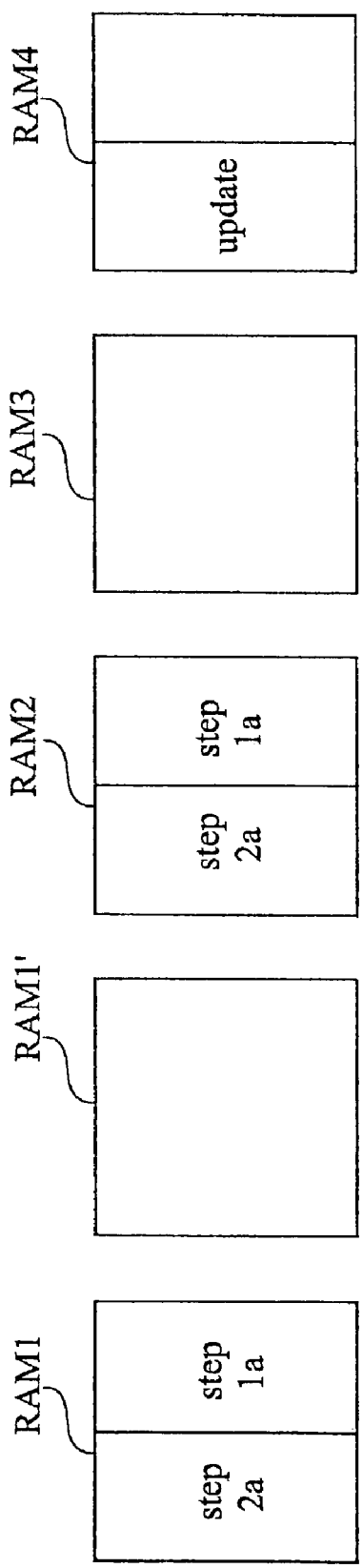

FIG. 3F illustrates a sixth step of the processing. FIG. 3F shows memories RAM1, RAM1', RAM2, RAM3, as well as a RAM RAM4, of dimensions 32×32. The first and second processors both use the columns of memories RAM1 and RAM2. The second processors perform the actual decoding of the columns used for the calculation of the syndromes calculated during the fifth phase, formed from the first 16 columns of memories RAM1 and RAM2. This is indicated by mention "step 2a" in FIG. 3F. The result of the decoding is stored in memory RAM4. The first processors carry out the first step of the second half-iteration of block N, that is, the syndrome calculation for 16 columns formed of a sum of the last 16 columns of memories RAM1 and RAM2.

Figure 3G:
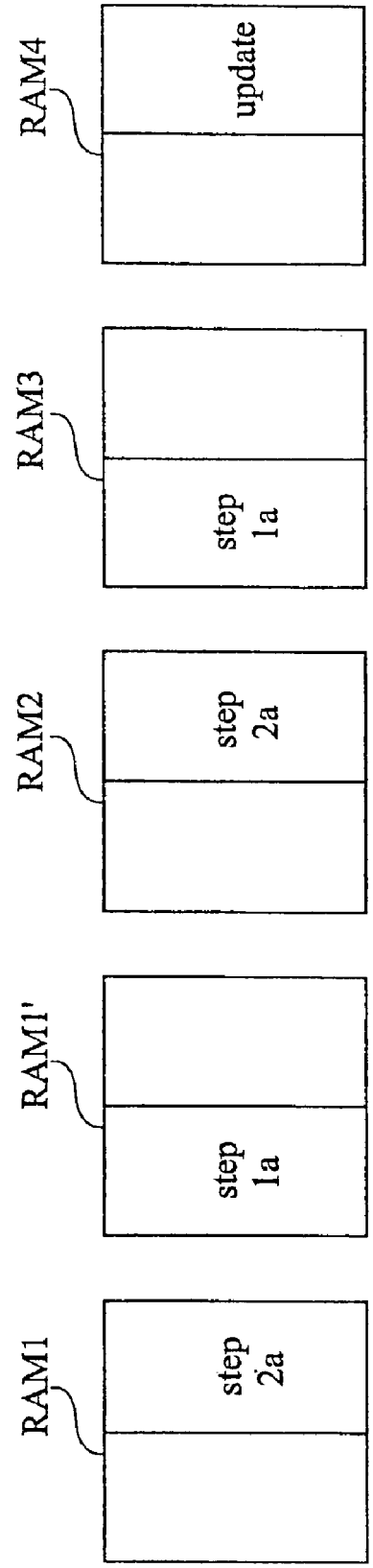

FIG. 3G illustrates a seventh phase of the processing. During the seventh phase, the second processors act on memories RAM1 and RAM2, to decode the last 16 columns. The result of the decoding is stored in memory RAM4. At the end of the seventh processing phase, memory RAM4 thus contains block N updated after the first iteration. Further, during the seventh phase, the first processors calculate, for the second half-iteration of block N+1, the syndrome of columns of rank 1 to 16 by means of the content of memories RAM1' and RAM3.

Figure 3H:
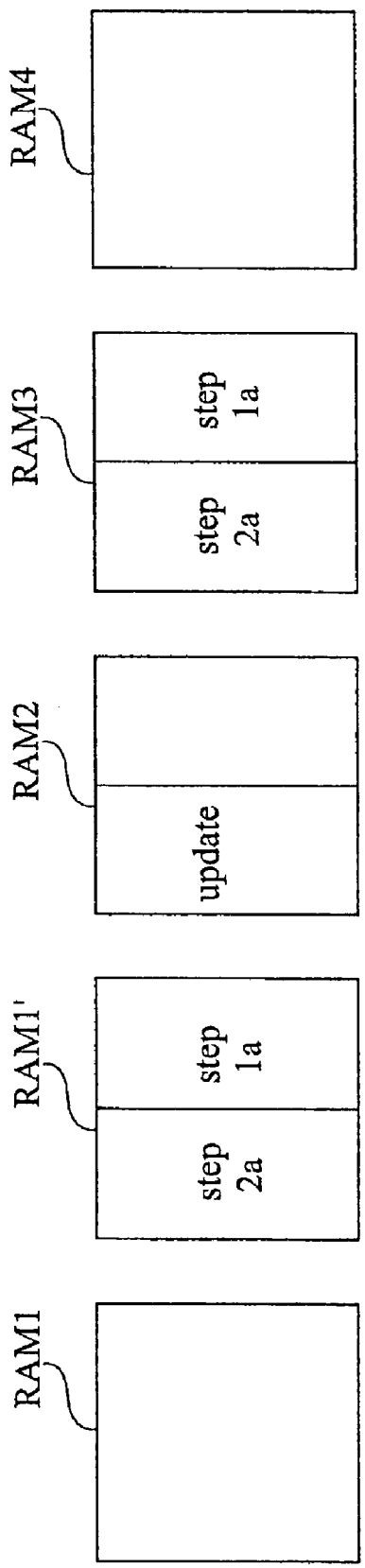

FIG. 3H illustrates an eighth phase of the processing. During the eighth phase, the first and second processors both act on memories RAM1' and RAM3 (block N+1). The second processors decode the columns of rank 1 to 16. The result of the decoding, that is, the updating of the first 16 columns of block N+1, is stored in the first 16 columns of memory RAM2, in place of the intermediary results relating to block N which are present therein and which are now useless. The first processors calculate the syndromes of the last 16 columns of block N+1.

Figure 3I:
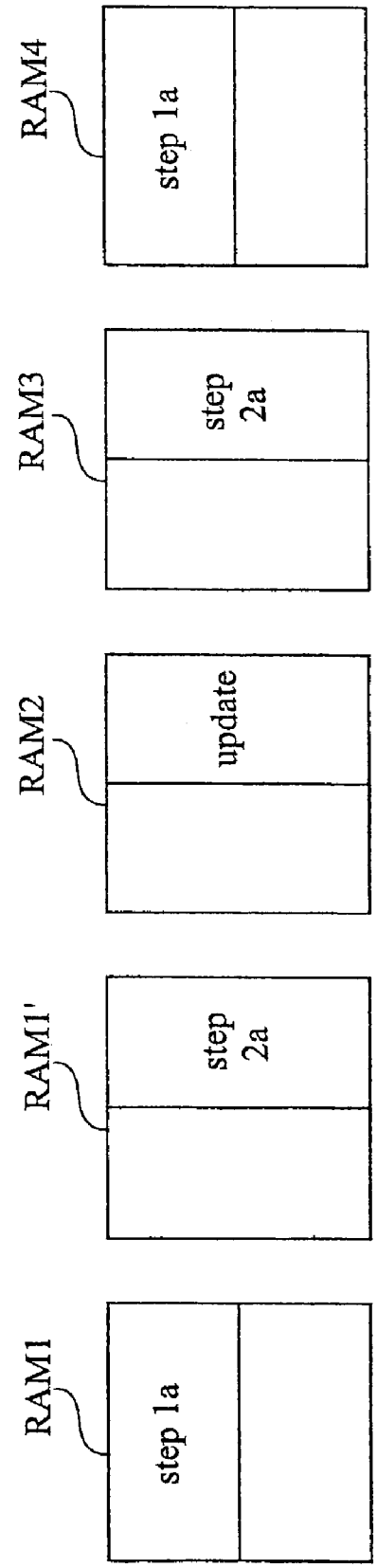

FIG. 3I illustrates a ninth phase of the processing, corresponding to the first processing phase, as will be seen. During the ninth phase, the last 16 columns of block N+1 are decoded by the second processors, and the result of the decoding is stored in the last 16 columns of memory RAM2, replacing the intermediary results which are present therein. At the end of the ninth phase, memory RAM2 thus contains block N+1, readjusted after the first iteration. Further, the first processors calculate the syndromes of the first 16 lines of block N for the second iteration. For this purpose, as for all the following iterations, the first processors operate on the sum of the lines contained in memory RAM1, corresponding to the original block N, and of the corresponding lines obtained after the iteration which has just ended. Here, the sum of the lines contained in memories RAM1 and RAM4 is performed to supply the first processors.

The ninth phase corresponds to the first phase, only memory RAM1 having been considered in FIG. 3A for the clarity of the discussion. After the ninth phase, the next phase corresponds to the phase described in relation with FIG. 3B.

A complete iteration for two blocks has thus been performed in eight phases, of a total duration substantially equal to $8d$. These figures are to be compared to those of prior art, where an iteration lasts for $48d$ per block, that is, $96d$ for two blocks. Due to the rapidity of the turbo-decoding according to the present invention, a single turbo-decoding can perform all the required iterations in real time, even at high flow rates. This results in compact turbo-decoders.

It should be noted that the turbo-decoding method described in relation with FIGS. 2A, 2B, 3A to 3I is an example only and can have many modifications within the abilities of those skilled in the art. In particular, the order of the phases, as well as the operations performed in a specific phase, may be modified without departing from the present invention.

For example, in the first phase, the first processors may calculate the syndromes of the lines of rank 17 to 32, instead of the syndromes of the first sixteen lines of memory RAM1, the subsequent modifications being within the abilities of those skilled in the art. For example, with the above modification, the first step of the second phase (FIG. 3B) must then be performed on the first sixteen lines, while the second step is performed on the lines of rank 17 to 32.

It should be noted that, for any iteration, the column decoding is performed not only by means of the lines updated in the first half-iteration of the iteration, but also by means of the lines of the original block. The column decoding may be performed by means of the sum of the lines of the original block and of the lines updated in the preceding half-iteration, as described, or by means of any appropriate linear combination of these lines.

An example of a turbo-decoding circuit 20 will now be described in relation with FIG. 4. Circuit 20 enables performing four successive iterations in real time, for flow rates reaching 54 Mbits/s, with blocks of dimension 32×32.

Turbo-decoding circuit 20 includes an input IN' and an output OUT'. Input IN' of circuit 20 receives the received analog words, corresponding to the transmitted bits, here with values −1 and +1. A processing block 22 is coupled to input IN'. Block 22 codes over four bits the received words and arranges them in a table of dimension 32 by 32, corresponding to the block to be decoded. A unit 23 DEPUNC, connected to block 22, enables performing the operations inverse to the shortening and to the puncturing. For this purpose, unit 23 DEPUNC provides the locations of the block where zeros have been inserted in the data, as well as the location where redundancy bits $C_i$ and $C'_i$ have been punctured. The output of block 22 supplies a bus 25. Bus 25 is a bus able to convey in parallel words of 5 bits, corresponding to four bits of the original words plus a possible overflow bit due to the various calculations performed afterwards. To bus 25 are connected various groups of RAMs, as well as 16 first processors 26 PROC1 and 16 second processors 26' PROC2. Processors PROC1 enable carrying out the first step of the decoding (syndrome calculation) and processors PROC2 enable carrying out the second step (actual decoding or updating). The writing into or the reading from the various memories, as well as the control of the first and second processors, are performed by a controller 27.

Figure 4:
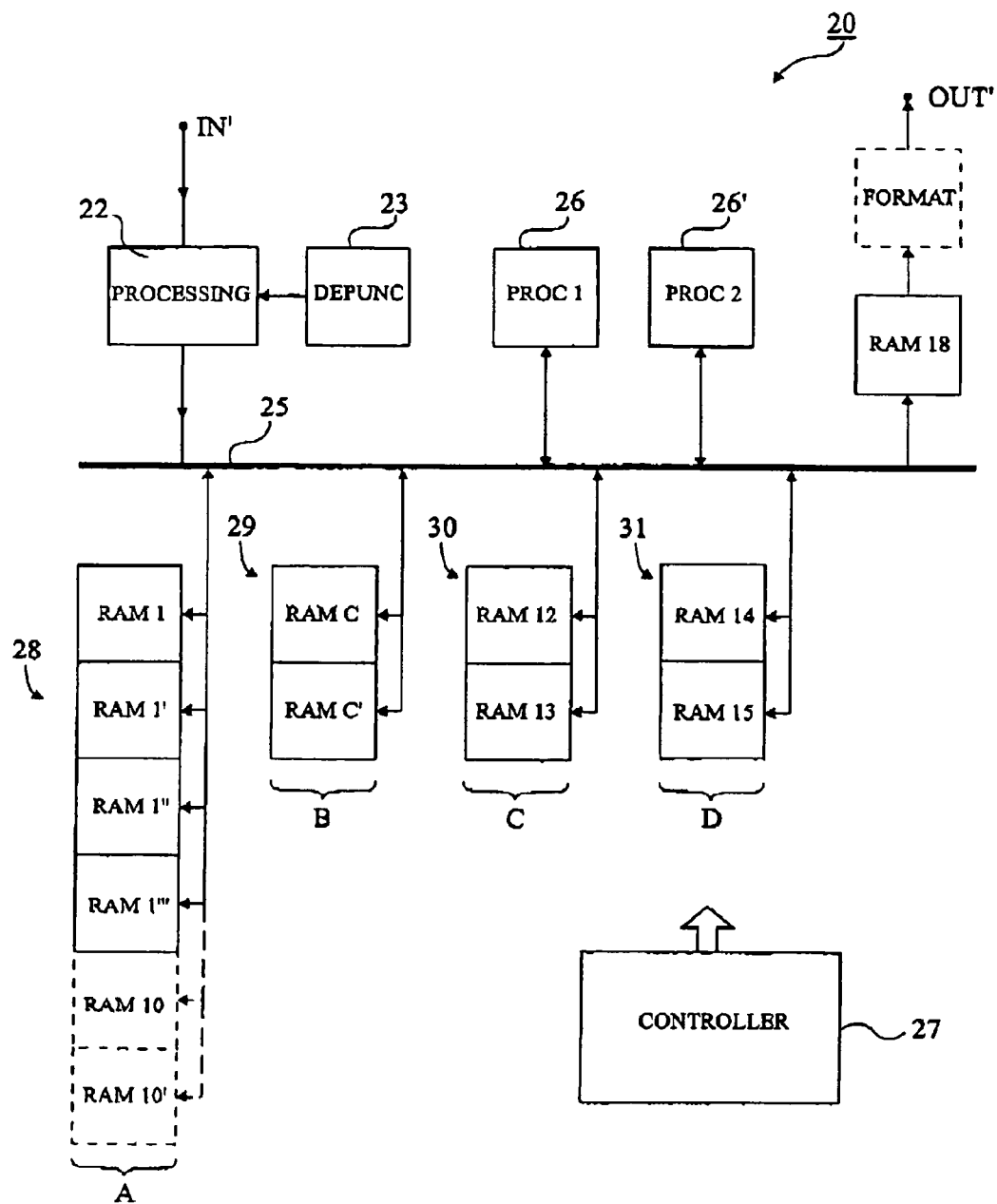
FIG. 4 illustrates a turbo-decoder according to the present invention.

In FIG. 4, a first memory group 28, A, includes two memories RAM1 and RAM1', of dimension 32×32. These memories correspond to the memories of same designation described in relation with the method relative to FIGS. 3A to 3I, and are in charge of respectively storing blocks N and N+1. The first memory group further includes RAMs RAM1" and RAM1'", both of dimension 32×32. Memories RAM1" and RAM1'" are provided to respectively store blocks N+2 and N+3 upon their arrival. Thus, when the processing of blocks N and N+1 is over, memories RAM1" and RAM1'" contain blocks N+2 and N+3, and the processing is not interrupted.

Memory group A also includes two RAMs RAM10 and RAM10'. Memories RAM10 and RAM10' each have the ability of storing a block and are optional. As will be seen hereafter, memories RAM10 and RAM10' are used in the case where two circuits 20 are coupled in series, to perform up to 8 iterations.

Of course, each memory of group A has a direct access to bus 25 and can be written into or read from independently from the others under control of controller 27.

A second memory group 29, B, includes two RAMs RAM C and RAM C', both having the capacity of containing one block. Circuit 20 includes memories RAM C and C' since the memories of group A are conventional RAMs, enabling reading or writing in one direction only. In the described example, memories RAM1 and RAM1' are accessible along the lines of the blocks that they enclose. Memories RAM C and RAM C' respectively enclose the words of blocks N and N+1 arranged so that the access to the blocks may be performed along the columns. Of course, if the circuit uses memories RAM1, RAM1', RAM1" and RAM1"' enabling both a reading along the lines and the columns, memories RAM C and RAM C' are useless and may be eliminated.

A third memory group 30, C, includes two RAMs, RAM12 and RAM13. Memories RAM12 and RAM13 each have the capacity of storing one block. These are working memories.

A fourth memory group 31, D, includes two RAMs, RAM14 and RAM15. Memories RAM14 and RAM15 each have the capacity of storing a block. They may be used as working memories or as output buffers.

As for group A, each of the memories of groups B, C, and D have a direct access to bus 25.

Circuit 20 further includes a RAM RAM18 adapted to storing a block after processing for sending it to other circuits. Memory RAM18 may be followed by an optional unit FORMAT, which will be detailed hereafter.

The operation of circuit 20 will now be described in relation with FIGS. 3A to 3I.

In the first processing phase (see FIG. 3A), the first sixteen lines of block N, contained in memory RAM1, are transmitted over bus 25 to processors PROC1. Processors PROC1 calculate the syndromes of the first 16 lines, and the result of the calculation is transmitted to processors PROC2 for the actual decoding step (second phase, FIG. 3B). The updating of the first 16 lines of block N, that is, the first 16 lines after the first half-iteration, are stored in memory RAM12. "Updating" here means, as said, the result of the actual decoding multiplied by a coefficient ranging between zero and one, which coefficient increases along with the iteration number. Meanwhile, processors PROC1 calculate the syndrome of the lines of rank 17 to 32 of block N.

In the third phase, (FIG. 3C), the lines of rank 17 to 32 of block N are decoded and the updating of these lines is stored in memory RAM12 which, at the end of the third phase, contains all the lines of block N after the first half-iteration. During this phase, the syndromes of the first 16 lines of block N+1, contained in memory RAM1, are calculated. At each first half-iteration of each block, the lines of RAM1 (respectively RAM1') are stored in memory RAMC (respectively RAMC').

For the second half-iteration relating to block N, which occurs during the fifth phase (FIG. 3E), since the original block must be read in columns, memories RAMC and RAM12 are used. The updating of the columns of block N (FIGS. 3F and 3G) is stored in memory RAM14, that can be read from along the lines.

The four memories RAM12, RAM13, RAM14, and RAM15 may be considered as working memories playing the function of memories RAM2, RAM3, and RAM4 used in the description of the method in relation with FIGS. 3A to 3I.

When the four iterations of a block are over, the processed block is stored in memory RAM18 for its provision by output OUT'. The processed block may transit through unit FORMAT, connecting memory RAM18 to output OUT'. Unit FORMAT has the function of giving the provided block a form accessible to the external circuit. For example, unit FORMAT only provides the wanted data after decoding D'i, that is, without the redundancy codes and without the additional filling zeros which have been introduced in the coding.

Circuit 20 enables, in a single integrated circuit, performing four iterations in real time at relatively high flow rates. If a greater number of iterations is desired, a first circuit 20 may be arranged in series with a second circuit 20, which enables performing 8 iterations. Second circuit 20 uses memories RAM10, RAM10'. Indeed, second circuit 20, for iterations 5 to 8 of block N, needs the original block N and the block N updated after the fourth iteration. Two line-reading input memories (RAM1 and RAM10) are thus necessary for block N. Memory RAM10' corresponds to memory RAM10, but is used for block N+1.

Of course, the present invention is likely to have various alterations, modifications, and improvements which will readily occur to those skilled in the art. In particular, the turbo-decoding circuit may have other elements than those shown in FIG. 4. For example, part or all of the described memories may belong to a single memory of sufficient capacity.

Unit FORMAT may be totally absent or belong to an external circuit. Similarly, processing block 22 and unit DEPUNC may be external to the circuit.

Parameters t1 and t2 may be unequal and take other values than those described in the examples. Also, parameters n1 and n2 may be unequal. Generally speaking, circuit 20 may be adapted to specific values of parameters t1, t2, n1, and n2, provided to the turbo-decoding circuit for a specific use, any logic enabling adaptation of the circuit operation to the chosen specific case.

The number of iterations (from 1 to 4 for a circuit, up to 8 for two circuits in series) may be chosen according to the application. The selected number of iterations may be different from an integer, and the result of the decoding may be provided after an integral number of half-iterations.

The number of the first or of the second processors in parallel may be different from the value chosen in the described examples. Generally speaking, the number of the first processors in parallel is equal to n and the number of the second processors in parallel is equal to m, n and m being numbers that may be different.

The present invention is not limited to the turbo-decoding of data coded by BCH or extended BCH coding, but is applicable to any turbo-decoding of data coded by blocks.

The simultaneously-processed blocks may be consecutive or not. For example, block N and block N+2 may be simultaneously processed while blocks N+1 and N+3 are simultaneously processed. More than two blocks may also be simultaneously processed. Generally speaking, according to the present invention, if a turbo-decoding requires y independent steps, the y steps may be, if required, performed simultaneously on y different blocks.

Also, the present invention has been described in the context of data transmission. The present invention of course applies to other applications, such as data storage, for example, on a CD-ROM or a hard disk.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for decoding data coded by blocks by a turbocode, the method comprising steps of:
   (A) calculating a syndrome for the coded data;
   (B) decoding the data using the syndrome, wherein step (B) is performed on a second portion of a first data block while step (A) is performed on a first portion of the first data block; and
   (C) using n first processors to perform at least one of (A) and (B), wherein the n first processors are adapted to operate in parallel on n lines, or columns, of the first data block, and n is greater than 2.

2. The method of claim 1, wherein step (B) uses m second processors adapted to operate in parallel on m lines, or columns, of a block.

3. The method of claim 2, wherein a data block has dimensions 32×32 and wherein n=m=16.

4. The method of claim 1, wherein the data are coded by a coding of BCH or extended BCH type.

5. The method of claim 4, wherein step (B) implements a Berlekamp algorithm or a Euclid algorithm followed by a Chase-Pyndiah algorithm.

6. A circuit for decoding turbo codes, the circuit comprising:
   at least one first processor configured to operate on at least a first portion of a block of turbocoded data to perform a first decoding operation;
   at least one second processor configured to operate on at least a second portion of the block of turbocoded data in parallel to the first processor operating on the first portion to perform a second decoding operation; and
   at least one third processor configured to operate on at least a third portion of the block of turbocoded data in parallel to the first processor operating on the first portion and the second processor operating on the second portion to perform a third decoding operation.

7. The circuit of claim 6, wherein the at least one first processor is operative to calculate a syndrome of a first line or column of a block of turbocoded data.

8. The circuit of claim 6, wherein the at least one second processor is operative to decode a line or column of a block of turbocoded data.

9. The circuit of claim 6, further comprising at least 14 additional processors configured to operate on 14 additional portions of the block of turbocoded data in parallel, and further comprising at least 15 additional processors configured to operate on 15 additional portions of the block of turbocoded data.

10. The circuit of claim 6, further comprising a bus connected to the at least one first processor and the at least one second processor, to convey turbocoded data to the at least one first processor and the at least one second processor.

11. The circuit of claim 10, further comprising a processing block to receive analog words, code the analog words over a plurality of bits, form the blocks of turbocoded data, and supply the blocks of turbocoded data to the bus.

12. The circuit of claim 11, further comprising a depuncture unit for supplying to the processing block locations of zeros and redundancy bits in blocks of turbocoded data.

13. The circuit of claim 10, further comprising at least one first RAM connected to the bus to store blocks of data.

14. The circuit of claim 13, further comprising a second RAM connected to the bus to store a block of turbocoded data after processing of the block is complete.

15. The circuit of claim 14, further comprising a controller to control writing and reading of the at least one first RAM and the second RAM.

16. The circuit of claim 15, wherein the at least one first RAM is a plurality of RAMs, configured as a plurality of groups.

17. The circuit of claim 16, wherein the plurality of groups comprises a first group of RAMs, each RAM of the first group operative to access a stored block of data along lines of the stored block.

18. The circuit of claim 17 wherein the plurality of groups of RAMs further comprises a second group of RAMs, each RAM of the second group operative to access a stored block of data along columns of the stored block.

19. The circuit of claim 6, wherein the circuit is operative to perform a plurality of iterations in real time, wherein an iteration comprises calculating a syndrome of a line or column of a block of turbocoded data and decoding the line or column based on the calculated syndrome.

* * * * *

UNITED STATES PATENT AND TRADEMARK OFFICE
CERTIFICATE OF CORRECTION

PATENT NO. : 7,594,156 B2
APPLICATION NO. : 10/324247
DATED : September 22, 2009
INVENTOR(S) : Mejean et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 614 days.

Signed and Sealed this

Twenty-eighth Day of September, 2010

David J. Kappos
*Director of the United States Patent and Trademark Office*